(12) United States Patent
Motani et al.

(10) Patent No.: US 9,755,134 B2
(45) Date of Patent: Sep. 5, 2017

(54) PIEZOELECTRIC DEVICE

(71) Applicant: TDK CORPORATION, Tokyo (JP)

(72) Inventors: Ryuta Motani, Tokyo (JP); Kazuo Nagata, Tokyo (JP); Mitsunao Homma, Tokyo (JP)

(73) Assignee: TDK CORPORATION, Tokyo (JP)

( * ) Notice: Subject to any disclaimer, the term of this patent is extended or adjusted under 35 U.S.C. 154(b) by 513 days.

(21) Appl. No.: 14/182,589

(22) Filed: Feb. 18, 2014

(65) Prior Publication Data
US 2014/0319973 A1 Oct. 30, 2014

(30) Foreign Application Priority Data

Apr. 25, 2013 (JP) ................. 2013-092888

(51) Int. Cl.
*H01L 41/047* (2006.01)
*G11B 5/48* (2006.01)
*H01L 41/04* (2006.01)

(52) U.S. Cl.
CPC .......... *H01L 41/047* (2013.01); *G11B 5/4873* (2013.01); *H01L 41/04* (2013.01)

(58) Field of Classification Search
CPC ...... G11B 5/4873; H01L 41/04; H01L 41/047
USPC ....... 310/365, 366, 340, 363, 364, 328, 314, 310/344, 367; 316/13
See application file for complete search history.

(56) References Cited

U.S. PATENT DOCUMENTS

| 6,661,618 | B2 * | 12/2003 | Fujiwara | G11B 5/5552 |
| | | | | 360/294.4 |
| 7,545,083 | B2 | 6/2009 | Chiba et al. | |
| 8,233,245 | B2 * | 7/2012 | Soga | G11B 5/4833 |
| | | | | 360/294.4 |
| 2002/0053860 | A1 * | 5/2002 | Mitarai | H01L 41/0472 |
| | | | | 310/366 |
| 2008/0067892 | A1 * | 3/2008 | Chiba | H03H 9/0547 |
| | | | | 310/314 |

FOREIGN PATENT DOCUMENTS

| JP | A-2002-190457 | 7/2002 | |
| JP | 2002-229271 | * 8/2006 | ............ H03H 30/02 |
| JP | A-2006-229271 | 8/2006 | |
| JP | A-2008-104151 | 5/2008 | |

* cited by examiner

*Primary Examiner* — Thomas Dougherty
*Assistant Examiner* — Karen B Addison
(74) *Attorney, Agent, or Firm* — Oliff PLC

(57) ABSTRACT

In a piezoelectric device, an identification pattern provided on a main face of a piezoelectric body is covered with an electrode, so as to inhibit the identification pattern from generating particles, while the identification pattern makes the polarity of the piezoelectric device discernible by the appearance thereof.

6 Claims, 5 Drawing Sheets

PIEZOELECTRIC DEVICE

BACKGROUND OF THE INVENTION

Field of the Invention

The present invention relates to a piezoelectric device.

Related Background Art

A hard disk drive (HDD) head suspension utilizing a pair of piezoelectric devices as an actuator for driving a slider has conventionally been known.

Since it is necessary for the pair of piezoelectric devices to be mounted to the HDD head suspension such that their directions of polarization differ from each other, e.g., they are mounted upside down of each other, it will be preferred if their polarities are discernible by appearance.

For example, Patent Literature 1 (Japanese Patent Application Laid-Open No. 2002-190457) discloses a technique for providing a marking on a surface of the device as one for discerning the directivity of a piezoelectric device by appearance.

SUMMARY OF THE INVENTION

In the piezoelectric device in accordance with the prior art mentioned above, however, particles may occur from the marking on the device surface, thereby adhering to magnetic heads and the inside of disks or contaminating the latter. This may degrade the reliability of the HDD.

In the technical field mentioned above, a piezoelectric device whose polarity is discernible by the appearance thereof, while inhibiting particles from occurring is required.

The piezoelectric device in accordance with one aspect of the present invention comprises a piezoelectric body having a pair of main faces opposing each other, an electrode arranged on the main face of the piezoelectric body, and an identification pattern disposed on the main face of the piezoelectric body and covered with the electrode.

In this piezoelectric device, the identification pattern disposed on the main face of the piezoelectric body is covered with the electrode and thus is inhibited from generating particles, while making the polarity of the piezoelectric device discernible by the appearance thereof.

The identification pattern may be constituted by a conductive material. When the identification pattern is made of an insulating material, the voltage applied to the piezoelectric body about the identification pattern partly lowers. Hence, when constituted by the conductive material, the identification pattern can function as a part of the electrode, thereby inhibiting the applied voltage from lowering. When constituted by a piezoelectric material, the identification pattern can also function as a part of the electrode, thereby inhibiting the applied voltage from lowering.

Thus, one aspect of the present invention provides a piezoelectric device whose polarity is discernible by appearance, while inhibiting particles from occurring.

DESCRIPTION OF THE PREFERRED EMBODIMENTS

In the following, embodiments of the present invention will be explained in detail with reference to the accompanying drawings. In the explanation, the same constituents or those having the same functions will be referred to with the same signs while omitting their overlapping descriptions.

A disk drive suspension 10 in accordance with an embodiment of the present invention will now be explained with reference to FIGS. 1 to 5.

Figure 1:
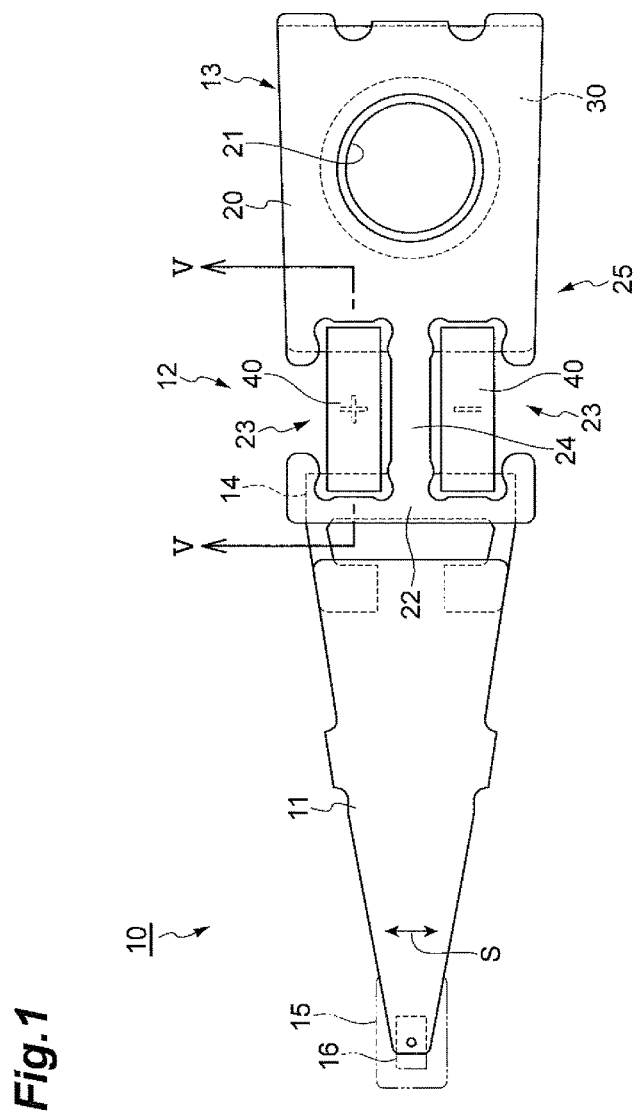
FIG. 1 is a schematic plan view illustrating a suspension in accordance with an embodiment.

The disk drive suspension 10 of a dual actuator type illustrated in FIG. 1 comprises a load beam 11, a microactuator unit 12, a base plate 13, and a hinge member 14.

The load beam 11 is made of a springy metal plate having a thickness of about 100 µm, for example, and has a leading end part to which a flexure 15 is attached. The flexure 15 is made of a thin leaf spring made of a metal thinner than the load beam 11. A slider 16 constituting a magnetic head is provided at a front end part of the flexure 15.

Figure 2:
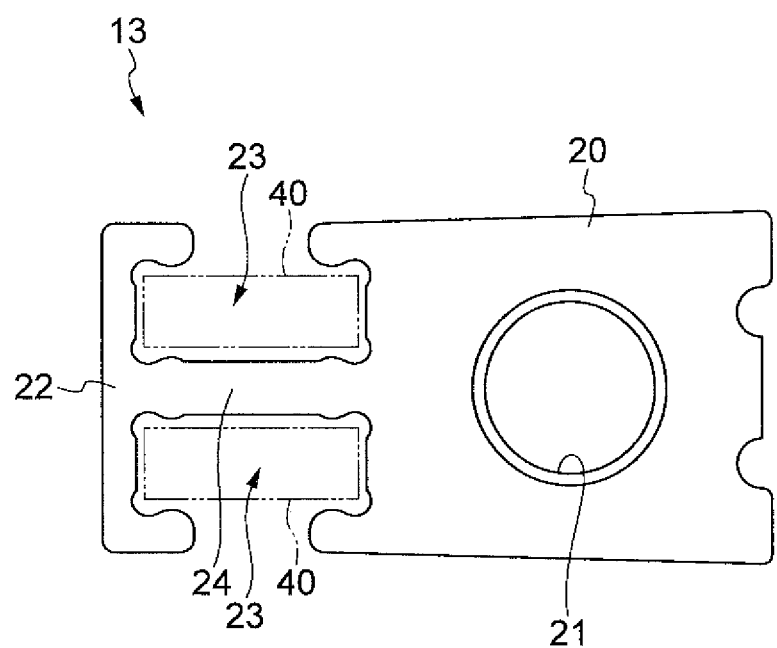
FIG. 2 is a plan view of a base plate illustrated in FIG. 1.

As FIG. 2 illustrates, a circular bossed hole 21 is formed in a base 20 of the base plate 13. A pair of openings 23, each having such a size as to be able to contain a piezoelectric device 40 which will be explained later, are formed between the base 20 of the base plate 13 and a front end part 22 thereof. A band-shaped joint 24 extending in the front-back direction of the base plate 13 (the axial direction of the suspension 10) is provided between the pair of openings 23. The joint 24 is deflectable to some extent widthwise of the base plate 13 (in sway directions indicated by arrows S in FIG. 1).

The base 20 of the base plate 13 is secured to a leading end part of an actuator arm driven by an undepicted voice coil motor and is driven to swing by the voice coil motor. The base plate 13 is made of a metal plate of stainless steel or the like having a thickness of about 200 µm, for example. In this embodiment, the base plate 13 and the hinge member 14 constitute an actuator base 25.

Figure 3:
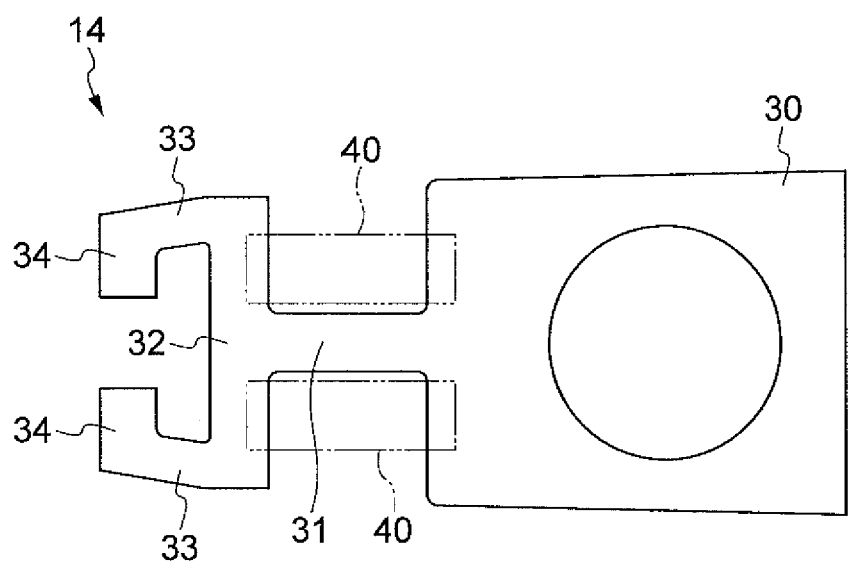
FIG. 3 is a plan view of a hinge member illustrated in FIG. 1.

As FIG. 3 illustrates, the hinge member 14 has a base 30 adapted to be mounted and secured onto the base 20 of the base plate 13, a band-shaped bridge part 31 formed at a position corresponding to the joint 24 of the base plate 13, an intermediate part 32 formed at a position corresponding to the front end part 22 of the base plate 13, a pair of hinge parts 33 having such a flexibility as to be elastically deformable in the thickness direction, leading end parts 34 secured to the load beam 11, and the like. The hinge member 14 is made of a springy metal plate having a thickness of about 50 µm, for example.

The microactuator unit 12 is mounted with a pair of piezoelectric devices 40 as a piezoelectric actuator. The piezoelectric devices 40, each shaped into a rectangular flat sheet, are contained in the respective openings 23 of the actuator base 25 such that their longitudinal directions are substantially parallel to each other and extend along the front-back direction of the base plate 13 (the axial direction of the suspension 10).

Figure 4:
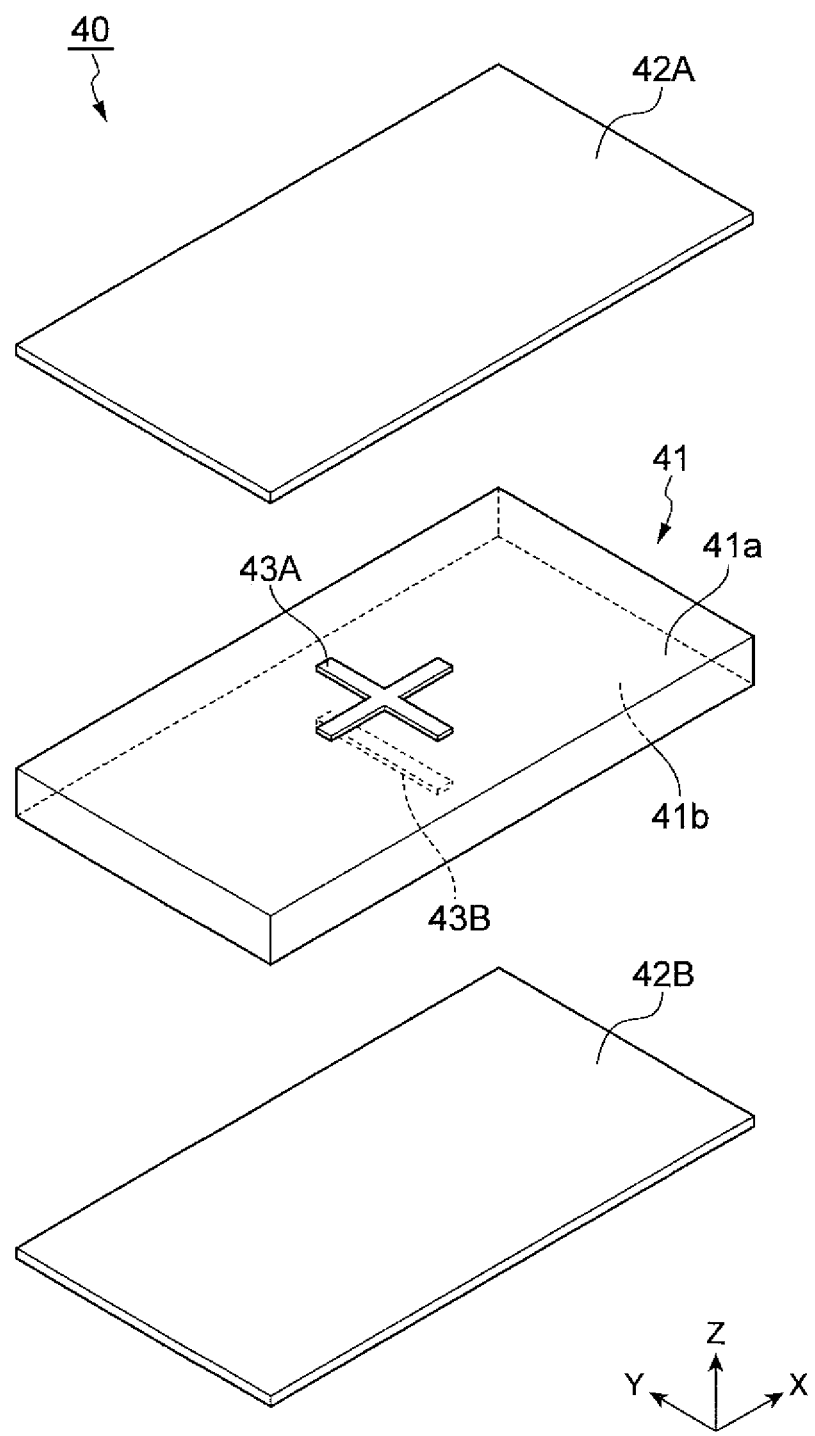
FIG. 4 is an exploded perspective view of a piezoelectric device mounted to the suspension of FIG. 1.
Figure 5:
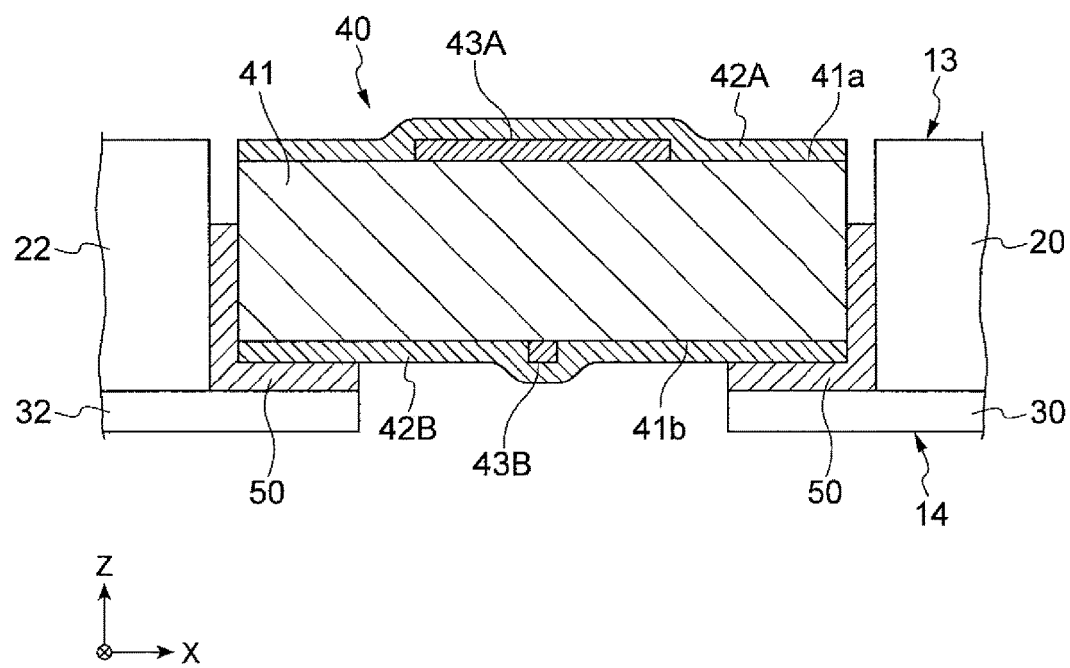
FIG. 5 is a sectional view of the piezoelectric element mounted to the suspension of FIG. 1 taken along the line V-V.

The structure of the piezoelectric device 40 will now be explained with reference to FIGS. 4 and 5. For convenience of explanation, the longitudinal, lateral, and thickness directions of the piezoelectric device 40 will be referred to as X, Y, and Z directions, respectively, as appropriate.

The piezoelectric device 40 is constituted by a piezoelectric body 41 and a pair of electrodes 42A, 42B respectively arranged on a pair of opposing main faces 41a, 41b of the piezoelectric body 41. In one example of sizes, the piezoelectric device 40 has a longitudinal length of 1.0 mm, a lateral length of 0.3 mm, and a thickness of 0.05 mm.

The piezoelectric body 41, which is shaped into a rectangular flat sheet, is constituted by a piezoelectric material such as PZT, for example. The piezoelectric body 41 is polarized such that its upper and lower faces 41a, 41b become positive and negative poles, respectively.

The main faces (upper and lower faces 41a, 41b) of the piezoelectric body 41 are formed with respective identification patterns 43A, 43B near their centers. Each of the identification patterns 43A, 43B is constituted by a conductive material such as Ag, an Ag—Pb alloy, or Au. The identification pattern 43A on the upper side is a plus (+)-shaped pattern indicating that the upper face 42a is on the positive pole side, whereas the identification pattern 43B on the lower side is a minus (−)-shaped pattern indicating that the lower face 42b is on the negative pole side. In one example of sizes, each of the identification patterns 43A, 43B has a thickness of 0.001 mm and a line width of 0.05 mm.

The piezoelectric body 41 having such identification patterns 43A, 43B can be formed as follows, for example.

First, a piezoelectric green sheet to become the piezoelectric body 41 is prepared. Subsequently, a conductive paste to become the identification patterns is printed on surfaces of the piezoelectric green sheet. Then, the piezoelectric green sheet is sintered together with the conductive paste (so-called co-firing). This produces the piezoelectric body 41 having the identification patterns 43A, 43B formed on the main faces 41a, 41b. The upper and lower faces 41a, 41b of the piezoelectric body 41 are free surfaces (surfaces keeping their sintered surface states).

The pair of electrodes 42A, 42B are provided so as to cover all the areas of the main faces 41a, 41b of the piezoelectric body 41. In the pair of electrodes 42A, 42B, the electrode 42A covering the upper face 41a side of the piezoelectric body 41 is a positive electrode, whereas the electrode 42B covering the lower face 41b side of the piezoelectric body 41 is a negative electrode. The electrodes 42A, 42B, each constituted by Au, are formed by a vacuum film-forming process such as plating, vapor deposition, or sputtering. Such a vacuum film-forming process can form electrodes having a denser surface state and produce less particles than sintering.

When mounting such piezoelectric devices 40 to the suspension 1, they are contained in the openings 23 of the base plate 13 such that their longitudinal direction (X direction) extends along the front-back direction of the base plate 13 (the axial direction of the suspension 10). At this time, a front end part of the piezoelectric device 40 is bonded and secured to the intermediate part 32 of the hinge member 14 so as to be supported thereby with an adhesive 50, while a rear end part of the piezoelectric device 40 is similarly secured to the base 30 of the hinge member 14 so as to be supported thereby with the adhesive 50.

In order to apply a voltage between the pair of electrodes 42A, 42B of the piezoelectric device 40, they are provided with respective undepicted electric leads. A conductive adhesive may be used for the above-mentioned adhesive 50, so as to utilize the adhesive 50 as a part of the electric leads.

When a pair of piezoelectric devices 40 are mounted to the suspension 10, controlling the voltage applied to the pair of piezoelectric devices 40 can expand one piezoelectric device 40 longitudinally by a predetermined length and contract the other piezoelectric device 40 longitudinally by the predetermined length. Thus, by controlling the expansion and contraction of each of the pair of piezoelectric devices 40, the suspension 10 can displace the load beam 11 side by a desirable amount widthwise (in the sway directions S).

Here, when mounted to the suspension 10, it is necessary for the pair of piezoelectric devices 40 to be upside down of each other as illustrated in FIG. 1 such that their directions of polarization differ from each other.

In the main faces 41a, 41b of the piezoelectric body 41, the positively polarized upper face 41a is provided with the plus-shaped identification pattern 43A, while the negatively polarized lower face 41b is provided with the minus-shaped identification pattern 43B, whereby the polarities of the piezoelectric devices 40 are easily discernible by the appearance thereof.

In addition, the identification patterns 43A, 43B are completely covered with the respective electrodes 42A, 42B, so as to prevent constituent materials from breaking away as particles from the identification patterns 43A, 43B.

In the piezoelectric devices 40, as explained in the foregoing, the fact that the identification patterns 43A, 43B disposed on the main faces 41a, 41b of the piezoelectric bodies 41 are covered with the electrodes 42A, 42B inhibits the identification patterns 43A, 43B from generating particles, while the identification patterns 43A, 43B make the polarities of the piezoelectric devices 40 discernible by the appearance thereof.

In the piezoelectric devices 40, the identification patterns 43A, 43B are constituted by a conductive material. When an identification pattern is made of an insulating material (an insulating material other than piezoelectric materials), the voltage applied to the piezoelectric body about the identification pattern partly lowers, thereby degrading functions (the above-mentioned expansion and contraction) as the piezoelectric device. In the piezoelectric device 40, however, the identification patterns 43A, 43B are constituted by a conductive material, so as to function as a part of the electrodes 42A, 42B, thereby inhibiting the applied voltage from lowering.

The present invention can be modified in various ways without being limited to the above-mentioned embodiment.

For example, effects similar to those mentioned above can also be exhibited when the identification patterns are constituted by a piezoelectric material instead of the conductive material. Such identification patterns can be obtained by printing and firing a piezoelectric paste (e.g., PZT paste) instead of the above-mentioned conductive paste on surfaces of a piezoelectric green sheet. In this case, the identification patterns function as a part of the piezoelectric body and thus inhibit the above-mentioned applied voltage from lowering as in the case where the identification patterns are constituted by a conductive material. The piezoelectric material constituting the identification patterns is preferably a piezoelectric material (e.g., PZT) having the same composition as with the piezoelectric body 41.

The identification patterns are not limited to the plus and minus forms but may be changed to other forms as appropriate as long as they differ from each other. It is not always necessary for both of the upper and lower faces of the piezoelectric body to be provided with identification patterns, but only one of the upper and lower faces may be provided with an identification pattern. The identification patterns may be any of other forms, letters, designs, and the like which are identifiable.

The piezoelectric body is not limited to a single-layer piezoelectric body, but may be a multilayer piezoelectric body in which piezoelectric layers and inner electrode layers are stacked alternately. When the piezoelectric body is a multilayer piezoelectric body, it will be preferred if the identification patterns are constituted by the same material as that of the internal electrode layers from the viewpoint of lowering stresses and the like.

It is not always necessary for the electrode to totally cover the identification pattern, but a part of the identification pattern may be exposed from the electrode. This also inhibits the identification pattern from generating particles from the part covered with the electrode. The electrode is not always required to cover the main face of the piezoelectric body as a whole, but may be disposed on a part of the main face.

What is claimed is:

1. A piezoelectric device comprising:
   a piezoelectric body having a pair of main faces opposing each other;
   an electrode arranged on the main face of the piezoelectric body; and
   an identification pattern disposed on and protruding from the main face of the piezoelectric body and covered with the electrode.

2. A piezoelectric device according to claim 1, wherein the identification pattern is constituted by a conductive material.

3. A piezoelectric device according to claim 1, wherein the identification pattern is constituted by a piezoelectric material.

4. A piezoelectric device according to claim 1, wherein the main surface is a free surface.

5. A piezoelectric device according to claim 1, wherein the identification pattern is constituted by an insulating material.

6. A piezoelectric device according to claim 1, wherein the identification pattern is disposed on each of the main surfaces of the piezoelectric body, and the shapes of the identification patterns differ from each other.

* * * * *